United States Patent
Aono et al.

(10) Patent No.: US 6,436,596 B1
(45) Date of Patent: Aug. 20, 2002

(54) QUALITY CONTROL METHOD FOR A PLANOGRAPHIC PRINTING PLATE

(75) Inventors: Koichiro Aono; Kei Okuno; Ikuo Kawauchi, all of Shizuoka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

(21) Appl. No.: 09/688,342

(22) Filed: Oct. 16, 2000

(30) Foreign Application Priority Data

Oct. 15, 1999 (JP) .......................................... 11-293357

(51) Int. Cl.$^7$ ................................................. G03F 7/26
(52) U.S. Cl. .......................................... 430/30; 430/944
(58) Field of Search ..................................... 430/30, 944

(56) References Cited

U.S. PATENT DOCUMENTS 4,004,923 A * 1/1977 Hensel ........................ 430/30

* cited by examiner

*Primary Examiner*—Cynthia Hamilton
(74) *Attorney, Agent, or Firm*—Burns, Doane, Swecker & Mathis, LLP

(57) ABSTRACT

A quality control method for a planographic printing plate having disposed on a substrate a photosensitive layer formed by a resin soluble in an aqueous alkali solution and a compound that absorbs light to generate heat, the quality control method having the steps of: (A) exposing, to an ultraviolet ray, a gray scale for evaluating a positive type planographic printing plate made by exposure to an ultraviolet ray, followed by development with a standard developing solution having a standard formula, and measurement of the sensitivity of the gray scale processed by the standard developing solution; (B) exposing, to an ultraviolet ray, a gray scale for evaluating a positive type planographic printing plate made by exposure to an ultraviolet ray in the same manner as in the step (A), followed by development with a developing solution to be evaluated, and measurement of the sensitivity of the gray scale processed by the developing solution to be evaluated; (C) comparing the sensitivity of the gray scale processed by the developing solution to be evaluated with the sensitivity of the gray scale processed by the standard developing solution; and (D) adjusting exposure/development conditions when the difference between the sensitivities exceeds a predetermined value as a result of the comparison of the sensitivity of the gray scale processed by the developing solution to be evaluated with the sensitivity of the gray scale processed by the standard developing solution.

6 Claims, No Drawings

QUALITY CONTROL METHOD FOR A PLANOGRAPHIC PRINTING PLATE

BACKGROUND OF THE INVENTION

1. Field of the Invention

The present invention relates to a quality control method for a planographic printing plate recordable by an infrared laser for so-called direct plate formation in which a plate can be formed directly by scanning an infrared laser based on digital signals from a computer or the like, and that is usable as an offset printing master.

2. Description of the Related Art

The development of lasers in recent years has been remarkable. In particular, the development of high-output, compact solid-state lasers and semiconductor lasers that have a light emission region in an infrared region from near infrared rays is advancing. These infrared lasers are extremely useful as a recording light source at the time a printing plate is formed directly on the basis of digital data from a computer or the like.

The positive type planographic printing plate material for an infrared laser, which material uses as an exposure light source an infrared laser having a light emitting region in an infrared region, is a planographic printing plate material having as essential components thereof a binder resin soluble in an aqueous alkali solution and an IR dye or the like that absorbs light to generate heat.

When the positive type planographic printing plate material for an infrared laser is exposed to the infrared laser, at non-exposed portions (image portions), the IR dye or the like in the positive type planographic printing plate material for the infrared laser works as a solution inhibitor to substantially reduce the solubility of the binder resin by interacting with the binder resin. In contrast, at exposed portions (non-image portions), since the IR dye or the like absorbs light to generate heat, interaction of the IR dye or the like with the binder resin becomes weak. Accordingly, exposed portions (non-image portions) are dissolved in an alkaline developing solution at the time of development, whereby the planographic printing plate is formed.

However, in such a positive type planographic printing plate material for an infrared laser, a latitude with respect to an activity of the developing solution is narrow in comparison with that of material of a positive type planographic printing plate made by exposure to an ultraviolet ray (UV). Therefore, there are problems in that, when the activity becomes high, reduction in the concentration of image portions and deterioration in printing durability are triggered, and when the activity becomes low, deficiencies in development are triggered.

These problems are caused by the following essential difference between the plate-making mechanisms of the positive type planographic printing plate material for the infrared laser and the material of the positive type planographic printing plate made by exposure to an ultraviolet ray.

The material of the positive type planographic printing plate made by exposure to an ultraviolet ray has as essential components thereof a binder resin soluble in an aqueous alkali solution and an onium salt, a quinone diazide compound and the like. Here, when the material of the positive type planographic printing plate made by exposure to an ultraviolet ray is exposed, at non-exposed portions (image portions), the onium salt or quinone diazide compound operates as a solution inhibitor in the same manner as those of the positive type planographic printing plate material for the infrared laser. Further, at exposed portions (non-image portions), the onium salt or quinone diazide compound is decomposed by light to produce an acid, thus operating, unlike those of the positive type planographic printing plate material for the infrared laser, as a dissolution accelerator for the binder resin. Consequently, in the material of the positive type planographic printing plate made by exposure to an ultraviolet ray, the difference between the solubility of the exposed portions and solubility of the non-exposed portions with respect to an alkaline developing solution is extremely large.

In contrast, in the positive type planographic printing plate material for the infrared laser, although the interaction between the IR dye or the like and the binder resin becomes weak at exposed portions (non-image portions) at the time of exposure, the difference between the solubility of exposed portions and the solubility of non-exposed portions is small because the IR dye cannot operate as a dissolution accelerator for the binder resin.

Process control for the purpose of continuously forming stable images by using an image forming material having a narrow latitude with respect to the activity of the developing solution is extremely difficult.

Ordinarily, an automatic developing machine having a replenishment mechanism to maintain developing solution sensitivity as constant as possible is used in developing the positive type planographic printing plate material for the infrared laser. The replenishment mechanism adds a replenishing solution having a high activity in order to prevent a decrease in the pH of the developing solution and deterioration of developability due to development processings of the plate or absorption of $CO_2$. Specifically, in an ordinary PS plate processing system, a method in which a replenishing solution is added to control conductivity so that it is kept constant, and a method in which a predetermined amount of replenishing solution is periodically added every time the number of plates for which development processing has been administered reaches a fixed numerical value or after a lapse of a fixed processing time have been proposed.

However, in the method in which conductivity is controlled, when the number of plates for which development processing has been administered increases and much of the composition of the photosensitive layer is dissolved, the pH of the developing solution becomes different even if the value of conductivity is the same as it was at the starting time, whereby a difference in developability arises.

Moreover, in the method in which a predetermined amount of replenishing solution is added at a fixed interval such as a fixed time or a number of planographic printing plates for which development processing has been completed, the composition amount of the photosensitive layer dissolved in the developing solution varies according to image area because the replenishment amount per unit area of the plate is prescribed. Further, the amount of $CO_2$ absorbed over time varies depending upon the installation environment of the automatic developing machine (i.e., temperature, humidity, $CO_2$ concentration or the like). Due to these factors, conditions change slightly. Hence, it has been difficult to continuously obtain uniform developability with a control at a fixed value.

The issues described above do not pose too much of a problem with an ordinary planographic printing plate that uses ultraviolet exposure since the latitude thereof is wide. However, because a positive type planographic printing plate material for an infrared laser has a narrow latitude, image forming properties become markedly different due to changes in the activity ratio of the developing solution, thus leading to problems relating to the quality of the planographic printing plate.

However, a method that is applicable to a generalized positive type planographic printing plate material for an infrared laser, and that can effectively prevent with a simple process control reduction in the concentration of image portions, deterioration in printing durability and deficiencies in development has yet to be discovered.

SUMMARY OF THE INVENTION

An object of the present invention is to provide a quality control method for simply evaluating and easily determining plate making conditions of a positive type planographic printing plate material for an infrared laser for use in direct plate making, in particular, an active state of a developing solution, feeding back the evaluation results to exposure/development processes, keeping the quality of a planographic printing plate constant, and continuously forming uniform images.

Using a gray scale made by ultraviolet exposure for the purpose of evaluating appropriate exposure conditions for a positive type planographic printing plate, the present inventors measured sensitivity for a case in which specific, standard exposure and development were carried out, and sensitivity at the time exposure and development to be evaluated were carried out. Both measurements were compared, suitability of developing conditions was easily detected, and the results were fed back. Thus, quality control for a planographic printing plate that can be conducted easily was devised.

The object of the present invention is achieved by a quality control method for a planographic printing plate having disposed on a substrate a photosensitive layer formed by a resin soluble in an aqueous alkali solution and a compound that absorbs light to generate heat, the quality control method comprising the steps of: (A) exposing, to an ultraviolet ray, a gray scale made by exposure to an ultraviolet ray for evaluating a positive type planographic printing plate, followed by development with a standard developing solution having a standard formula, and measurement of the sensitivity of the gray scale processed by the standard developing solution; (B) exposing, to an ultraviolet ray, a gray scale for evaluating a positive type planographic printing plate made by exposure to an ultraviolet ray in the same manner as in the step (A), followed by development with a developing solution to be evaluated, and measurement of the sensitivity of the gray scale processed by the developing solution to be evaluated; (C) comparing the sensitivity of the gray scale processed by the developing solution to be evaluated with the sensitivity of the gray scale processed by the standard developing solution; and (D) adjusting exposure/development conditions when the difference between the sensitivities exceeds a predetermined value as a result of the comparison of the sensitivity of the gray scale processed by the developing solution to be evaluated with the sensitivity of the gray scale processed by the standard developing solution.

DESCRIPTION OF THE PREFERRED EMBODIMENTS

The present invention will hereinafter be described in detail.

When developing conditions have deviated from standard developing conditions, undesirable reductions in concentration due to excessive development of image portions, edge unclarity and contamination due to residual film at non-image portions, and increases in concentration or the like occur. However, in the case of a planographic printing plate for forming various images, it has been difficult to detect misregistration from a target image. In the present invention, evaluation processes can be standardized by using a generalized gray scale to evaluate appropriate exposure conditions for a positive type planographic printing plate made by ultraviolet exposure.

The gray scale according to the present invention is a general-purpose gray scale in which a difference in plate surface energy in adjacent exposed portions is about 40%.

Using such gray scales to confirm plate formation conditions by applying them at predetermined intervals between planographic printing plates to be made in a device for general development and plate formation processings is common.

In the present invention, after a gray scale is exposed to an ultraviolet ray, (A) the gray scale is developed by a standard developing solution having a standard formula, the sensitivity of the gray scale is measured, and the sensitivity of the gray scale processed by the standard developing solution is obtained. This gray scale serves as a standard sample for basic developing conditions. Ingredients, treatment time, treatment temperature and the like of the developing solution used here are adopted as a standard process. The sensitivity of the gray scale processed by the standard developing solution, which sensitivity becomes an evaluation criterion, need not be measured in each evaluation. It is sufficient that only one sheet of gray scale is measured at an initial stage when evaluation and control are to be performed in continuous processes for similar plate formation processing.

Next, the sensitivity of a gray scale to be evaluated is measured to confirm fatigue and such of the developing solution after an elapse of time. At the point in time in which the evaluation becomes necessary, exposure and development are performed by using the gray scale in the same manner as described above. This is a step (B) of measuring the sensitivity of the gray scale processed by a target developing solution, in which the gray scale exposed to an ultraviolet ray under conditions similar to those described above is developed in the same manner as the above-described gray scale processed by the standard developing solution except for the use of a developing solution to be evaluated. At this time, conditions such as development processing temperature, processing time and the like are made to be the same as the conditions in which the sensitivity of the gray scale processed by the standard developing solution was measured.

Subsequently, in a step (C), the sensitivity of the gray scale that becomes the standard for evaluation and the sensitivity of the target gray scale, which are obtained as described above, are compared. Because the evaluation is conducted on the basis of a one-to-one comparison, differences can easily be detected. The sensitivity may be evaluated by visually observing the plate surface, or images obtained by printing with a planographic printing plate may be compared. Preferably, from the standpoint of convenience, the number of levels of the gray scale in which predetermined levels of the gray scale are a complete solid image (in the present invention, hereinafter referred to as a solid sensitivity) and the number of levels of the gray scale in which predetermined levels of the gray scale are complete non-image portions (hereinafter referred to as a clear sensitivity according to the present invention) are determined, and then the clear and/or solid sensitivities of the standard gray scale and the target gray scale are compared with each other. This is preferable to ensure that there are no variations in the evaluation. At this time, both or either of the clear and/or solid sensitivities may be compared.

In this manner, variations of exposure/development conditions can be easily detected by comparison with a sample subjected to the standard development processing. Consequently, the quality of the planographic printing plate can be rationally controlled by feeding the evaluation result of the planographic printing plate back to the processes of exposure, development and plate-making. That is, when a decline in the developability of the tested planographic printing plate processed by the target developing solution can be seen, exposure conditions are enhanced or development conditions are activated. When the planographic printing plate has been excessively developed, exposure conditions are lowered or development conditions are moderated.

A limit in the case where the evaluation result is fed back to the exposure/development processes may be determined by the uniformity of the desired planographic printing plate. In general, the time when the difference in the sensitivities of the gray scales becomes a 0.5 level or greater based on level evaluation in the gray scale becomes an index to feedback to the exposure/development processes.

In order to adjust the exposure process, the output, beam diameter, scanning rate, exposure time and the like of the laser beam may be adjusted to the desired conditions of exposure.

When development has been carried out excessively, measures that may be taken when the sensitivity is out of a prescribed range include the following.

In the development processing,
(1) add water to the developing solution;
(2) put dry ice into the developing solution;
(3) exhale $CO_2$ gas;
(4) lower a dilution ratio of the replenishing solution;
(5) reduce the setting for the replenishment amount of the automatic developing machine;
(6) lower the development temperature;
(7) shorten development time (increase conveyance speed of the automatic developing machine);
(8) reduce the pressure of a developing brush in the automatic developing machine;
(9) reduce the number of developing brushes in the automatic developing machine;
(10) reduce a discharge amount of spray;
(11) agitate the developing solution;
(12) replace the developing solution with a new one.

Additionally, measures that may be taken in the exposure process or other processes include the following.
(13) reduce exposure amount;
(14) heat the positive type planographic printing plate for an infrared laser before exposure.

Specifically, when the sensitivity of the gray scale is increased by a 0.5 level based on the evaluation according to the present invention, standard adjusting methods include means for reducing the exposure amount by about 30% to 50% so as to reduce activity, lowering the development temperature by 0.5° C. to 2° C., shortening the development time by about 10% to 30% (about 2 seconds as a standard) and the like. Needless to say, these means may be appropriately combined to perform optimum adjustment.

Measures that may be taken when there is a deterioration in developability and the sensitivity is out of a prescribed range include the following means:

In the development process,
(1) add replenishing solution;
(2) increase the dilution ratio of the replenishing solution;
(3) increase the setting for the replenishment amount of the automatic developing machine;
(4) raise the development temperature;
(5) prolong development time (the transporting speed of the automatic developing machine is decreased);
(6) increase the pressure of the developing brush in the automatic developing machine;
(7) increase the number of developing brushes in the automatic developing machine;
(8) increase the discharge amount of the spray;
(9) replace the developing solution with a new one.

Additionally, measures in the exposure process or other processes include the following means.
(10) increase the exposure amount.

Specifically, when the sensitivity of the gray scale has been lowered by a 0.5 level based on the evaluation according to the present invention, standard adjusting methods include means for increasing the exposure amount by 30% to 50% so as to increase activity, increasing the development temperature by 0.5° C. to 2° C., prolonging the development time by about 10% to 30% (about 2 seconds as a standard) and the like. Similar to the measures for countering decline in activity, in this case also, the above-described means may be combined for the adjustment.

Next, an image forming material to which the method of the present invention is applied will be described.

The image forming material of the present invention is not specifically limited as long as it is one in which a photosensitive layer composed of a positive photosensitive composition for an infrared laser is disposed on a substrate. The photosensitive layer has therein (a) a resin soluble in an aqueous alkali solution and (b) a compound that absorbs light to generate heat. In addition, the positive photosensitive composition for an infrared laser may be one in which additives ordinarily used have been added.

Examples of the resin (a) soluble in an aqueous alkali solution used in the present invention include a novolac resin, a polymer having a hydroxyaryl group at its side chain, and the like.

The novolac resin which can be used as the resin soluble in an aqueous alkali solution of the present invention is a resin prepared by condensing phenols and aldehydes under acidic conditions.

Examples of preferred novolac resins include, for example, a novolac resin composed of phenol and formaldehyde, a novolac resin composed of m-cresol and formaldehyde, a novolac resin composed of p-cresol and formaldehyde, a novolac resin composed of o-cresol and formaldehyde, a novolac resin composed of octyl phenol and formaldehyde, a novolac resin composed of m-/p-mixed cresol and formaldehyde, a novolac resin composed of a phenol/cresol mixture (any of m-, p-, o- or m-/p-, m-/o-, o-/p-mixed cresols) and formaldehyde and the like.

These novolac resins preferably have a weight average molecular weight of 800 to 200,000 and a numeric average molecular weight of 400 to 60,000.

Furthermore, preferable examples of the resin soluble in an aqueous alkali solution of the present invention include polymers having hydroxyaryl groups at their side chains.

In such polymers, the hydroxyaryl group signifies an aryl group having one —OH group or more connected thereto. Examples of the aryl group include a phenyl group, a naphthyl group, an anthracenyl group, a phenanthrenyl group and the like. In terms of availability and physical properties, the phenyl or naphthyl group is preferable. Consequently, the hydroxyaryl groups are preferably a hydroxyphenyl group, a dihydroxyphenyl group, a trihydroxyphenyl group, a tetrahydroxyphenyl group, a hydroxynaphthyl group, a dihydroxynaphthyl group and the like. These hydroxyaryl groups may further have a substituent such as a halogen atom, a hydrocarbon group containing 20 or fewer carbons, an alkoxy group containing 20 or fewer carbons or an aryl oxy group containing 20 or fewer carbons. Such a hydroxyaryl group as a side chain of the polymer is connected to a main chain of a polymer in a pendant manner, and further, may have a bonding group between the main chain and the same.

Preferable examples of the compound (b) that absorbs light to generate heat include well-known pigments and dyes.

Examples of pigments include commercially available pigments and pigments described in the Color Index (C.I.) catalog, *Saishin Ganryô Binran* ("Recent Pigment Catalog", edited by the Japan Pigment Technology Association, 1977), *Saishin Ganryô Ôyô Gijutsu* ("Recent Pigment Application Technology", published by CMC, 1986), and *Insatsu Inki Gijutsu* ("Ink Printing Technology", published by CMC, 1984).

Examples of the above-described pigments include black pigments, yellow pigments, orange pigments, brown pigments, red pigments, violet pigments, blue pigments, green pigments, fluorescent pigments, metallic powder pigments and polymeric combined coloring agents. Specifically, examples include insoluble azo pigments, azo lake pigments, condensed azo pigments, chelate azo pigments, phthalocyanine pigments, anthraquinone pigments, perylene and perinone pigments, thioindigo pigments, quinacridone, pigments, dioxazine pigments, isoindolynone pigments, quinophthalone pigments, dyed lake pigments, azine pigments, nitroso pigments, nitro pigments, natural pigments, fluorescent pigments, inorganic pigments, carbon black and the like.

These pigments may be used without surface treatment or after a surface treatment has been administered thereto. Examples of surface treatment methods include a method in which the surface is coated with a resin or wax, a method in which a surfactant is adhered, and a method in which a reactive substance (e.g., a silane coupling agent, an epoxy compound, polyisocyanate and the like) is bonded to the pigment surface. These surface treatment methods are described in *Kinzoku Sekken no Seishitsu to Ôyô* ("Properties and Application of Metallic Soap", published by Saiwai Shobô), *Insatsu Inki Gijutsu* ("Ink Printing Technology", published by CMC, 1984), and *Saishin Ganryô Ôyô Gijutsu* ("Recent Pigment Application Technology", published by CMC, 1986).

The particle diameter of the pigment is preferably 0.01 $\mu$m to 10 $\mu$m, more preferably, 0.05 $\mu$m to 1 $\mu$m, and most preferably, 0.1 $\mu$m to 1 $\mu$m.

A pigment particle diameter less than 0.01 $\mu$m may not be preferable in terms of the stability of dispersed materials in the photosensitive layer coating solution. On the other hand, a particle diameter of the pigment greater than 10 $\mu$m may not be preferable in terms of uniformity of the photosensitive layer.

Well-known dispersion techniques used in the production of ink or toner can be used as a method for dispersing the pigment. Examples include an ultrasonic dispersion device, a sand mill, an attritor, a pearl mill, a super mill, a ball mill, an impeller, a disperser, a KD mill, a colloid mill, a dynatron, a three-roll mill, a pressure kneader and the like. Details are described in *Saishin Ganryô Ôyô Gijutsu* ("Recent Pigment Application Technology", published by CMC, 1986).

Examples of dyes include commercially available dyes and well-known dyes described in references (e.g., *Senryô Binrani*,"Handbook of Dyes", edited by the Synthetic Organic Chemistry Association, 1980), such as azo dyes, metallic complex salt azo dyes, pyrazolone azo dyes, anthraquinone dyes, phthalocyanine dyes, carbonium dyes, quinone imine dyes, methine dyes and cyanine dyes.

Pigments or dyes that absorb infrared light or near-infrared light are preferable in particular, from the standpoint of being suitable for use with a laser emitting infrared light or near-infrared light.

Carbon black is preferably used as the pigment that absorbs infrared light or near-infrared light. Moreover, examples of dyes that absorb infrared light or near-infrared light include, for example, the cyanine dyes disclosed in Japanese Patent Application Laid-Open (JP-A) Nos. 58-125246, 59-84356, 59-202829 and 60-78787; the methine dyes disclosed in JP-A Nos. 58-173696, 58-181690 and 58-194595; the naphthoquinone dyes disclosed in JP-A Nos. 58-112793, 58-224793, 59-48187, 59-73996, 60-52940 and 60-63744; the squarylium dyes disclosed in JP-A No. 58-112792; the cyanine dyes disclosed in Great Britain Patent No. 434,875; and the like.

The near-infrared absorption sensitizer disclosed in U.S. Pat. No. No. 5,156,938 may also be suitably used as the dyes. Particularly preferable examples include the substituted aryl benzo(thio)pyrylium salt disclosed in U.S. Pat. No. 3,881,924; the trimethinethiapyrylium salt disclosed in JP-A No. 57-142645 (U.S. Pat. No. 4,327,169); the pyrylium compounds disclosed in JP-A Nos. 58-181051, 58-220143, 59-41363, 59-84248, 59-84249, 59-146063 and 59-146061; the cyanine coloring agent disclosed in JP-A No. 59-216146; the pentamethinethiopyrylium salt disclosed in U.S. Pat. No. 4,283,475; the pyrylium compounds disclosed in Japanese Patent Application Publication (JP-B) Nos. 5-13514 and 5-19702; Epolight 111-178, Epolight III-130, Epolight III-125 and Epolight V-176A; and the like.

Another example of a particularly preferable dye is the near-infrared absorbing dyes disclosed as formulae (I) and (II) in U.S. Pat. No. 4,756,993.

The amount of the pigment or dye to be added is preferably 0.01% to 50% by weight, and more preferably 0.1% to 10% by weight, with respect to the entire solid content of the printing plate material. In the case of the dye, the amount to be added is preferably 0.5% to 10% by weight. In the case of the pigment, the amount to be added is preferably 3.1% to 10% by weight.

When the amount of pigment or dye added is less than 0.01% by weight, the sensitivity may become low. When the amount exceeds 50% by weight, the uniformity of the photosensitive layer may be lost, and the durability of the recording layer may become poor.

The above-described pigment or dye may be added with other components to the same layer, or may be added to a layer other than the layer to which other components are added. When the pigment or dye is added to a layer other than the layer to which other components are added, in a state in which the pigment or dye is thermally decomposable and is not decomposed, the pigment or dye is preferably added to a pyrolizable layer adjacent to a layer having a substance that substantially lowers the solubility of a bonding resin. Furthermore, although the pigment or dye is preferably contained in the layer containing the bonding resin, it may be contained in another layer.

The photosensitive layer may contain other components, as desired. Examples of such components include various additives, such as substances that are thermally decomposable and, in a state in which they are not decomposed, substantially lower the solubility of polymer compounds soluble in an aqueous alkali solution, such as onium salts, o-quinonediazide compounds, aromatic sulfone compounds and aromatic ester sulfonate compounds. By adding an above-described additive, inhibition of the dissolution of image portions in the developing solution can be improved.

Examples of the above-described onium salt include diazonium salt, ammonium salt, phosphonium salt, iodonium salt, sulfonium salt, selenonium salt, arsonium salt and the like.

Among these salts, diazonium salt is particularly preferable, and the diazonium salt disclosed in JP-A No. 5-158230 is preferable as the diazonium salt.

As long as the above-described o-quinonediazide compound is a compound that has at least one o-quinonediazide group and whose alkaline solubility is increased by thermal decomposition, compounds of various structures may suitably be used.

Since the o-quinonediazide compound has both of the effect of causing the binder to lose its dissolution-suppressing property by thermal decomposition and the effect in which the o-quinonediazide itself changes to an alkaline soluble substance, it can function as a dissolution accelerating agent for the binder.

The amount of the o-quinonediazide compound added is preferably 1% to 50% by weight, more preferably 5% to 30% by weight, and most preferably 10% to 30% by weight, with respect to the entire solid content of the printing plate material.

Examples of counter ions of the above-described onium salt include tetrafluoride boric acid, hexafluoride phosphoric acid, triisopropylnaphthalenesulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoyl-benzenesulfonic acid, paratoluenesulfonic acid and the like. Among these, preferable examples include alkyl aromatic sulfonic acids such as hexafluoride phosphoric acid, triisopropylnaphthalenesulfonic acid and 2,5-dimethylbenzenesulfonic acid.

The amount added of additives other than the o-quinonediazide compound is preferably 1% to 50% by weight, more preferably 5% to 30% by weight, and most preferably 10% to 30% by weight. It is preferable that the additive and the binder are contained in the same layer.

For the purpose of further enhancing sensitivity, cyclic anhydrides such as phthalic anhydride, phenols such as bisphenol A and p-nitrophenol, or organic acids such as p-toluenesulfonic acid and dodecylbenzenesulfonic acid may also be added The proportion of the cyclic anhydride, phenol or organic acid in the printing plate material is preferably 0.05% to 20% by weight, more preferably 0.1% to 15% by weight, and most preferably 0.1% to 10% by weight.

The photosensitive layer may contain a surfactant (e.g., the fluorine based surfactant disclosed in JP-A No. 62-170950) in order to improve coatability. The content of the surfactant is preferably 0.01% to 1% by weight, and more preferably 0.05% to 0.5% by weight, with respect to the image recording material.

The image forming material of the present invention is formed by coating on a substrate the above-described components after the components have been dissolved in a solvent.

The substrate is preferably a dimensionally stable, plate-like substrate such as paper, paper laminated with a plastic (e.g., polyethylene, polypropylene, polystyrene or the like), a metal plate (e.g., aluminum, zinc, copper or the like), a plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal or the like), a paper or plastic film laminated or deposited with an above-described metal, and the like.

A polyester film or an aluminum plate is preferably used as the substrate. In particular, an aluminum plate is preferably used since it is dimensionally stable and relatively inexpensive. Preferable examples of the aluminum plate include a pure aluminum plate and an alloy plate having mainly aluminum and a fine amount of dissimilar elements. Furthermore, a plastic film laminated or deposited with aluminum may be used. Examples of dissimilar elements that may be contained in the aluminum alloy include silicon, iron, manganese, copper, magnesium, chromium, zinc, bismuth, nickel, titanium and the like. The content of the dissimilar elements contained in the alloy is no more than 10% by weight. Pure aluminum is particularly suitable for the present invention. However, because completely pure aluminum is extremely difficult to manufacture from the standpoint of refinement technology, aluminum that contains slight amounts of dissimilar elements may also be used. There are no particular limitations on the composition of the aluminum plate used in the present invention, and an aluminum plate formed of conventionally known and commonly used materials may appropriately be used. The thickness of the aluminum plate is preferably about 0.1 mm to 0.6 mm, more preferably 0.15 mm to 0.4 mm, and most preferably 0.2 mm to 0.3 mm.

Prior to roughening the surface of the aluminum plate, a degreasing treatment with a surfactant, an organic solvent, or an alkaline water solution may be administered to the aluminum plate in order to eliminate rolling oil on the surface as needed.

The surface of the aluminum plate may be roughened in accordance with various methods. Examples thereof include a method in which the surface is mechanically roughened, a method in which the surface is electrochemically dissolved and roughened, and a method in which the surface is chemically roughened by selectively dissolving the surface. Examples of the mechanically roughening method include known methods such as a ball polishing method, a brushing method, a blasting method and a buffing method. Examples of the electrochemical roughening method include a method in which an alternating current or a direct current is passed through an electrolytic solution of hydrochloric acid or nitric acid.

Following alkaline etching and neutralization processing as needed, the aluminum plate thus roughened may be subjected to anodic oxidation as needed in order to raise the water retention and wear resistance of the surface. The amount of film subjected to anodic oxidization is preferably 1.0 g/m$^2$ or more. When the amount of anodic oxidized film is less than 1.0 g/m$^2$, printing durability becomes insufficient, and when the aluminum plate is used as a planographic printing plate, so-called "scratch toning", in which scratches become easily generated at non-image portions and ink adheres to the scratched portions at the time of printing, easily occur.

After anodic oxidization, the surface of the aluminum plate may be subjected to hydrophilic processing as needed.

The concentration of the positive type photosensitive composition for the infrared laser (the entire solid content including additives) in the solvent is preferably 1% to 50% by weight. Although it varies according to the purpose, when used in the production of a photosensitive planographic printing plate, a preferable coating amount (the solid content) on the substrate after the coating and drying is generally 0.5 g/m$^2$ to 5.0 g/m$^2$.

There are no particular limitations on the coating method. Examples thereof include well-known coating methods such as bar coating, rotating coating, spray coating, curtain coating, dip coating, air-knife coating, blade coating and roll coating.

As the coating amount becomes less, the apparent sensitivity becomes greater but the film characteristics of the photosensitive layer deteriorate.

The image forming material described is subjected to image exposure and development processing to form a planographic printing plate.

A light source having an emission wavelength in an infrared region from a near-infrared region, particularly a solid laser or a semiconductor laser, is preferable as the light source having the active light beam used in image exposure.

Conventionally known aqueous alkali solutions may be used as the developing solution or the replenishing solution used in the development processing. Examples thereof include inorganic alkali salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide and lithium hydroxide. Further examples include organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine. These aqueous alkali solutions may be used singly or in combinations of two or more.

Among these aqueous alkali solutions, silicate solutions such as sodium silicate and potassium silicate are particularly preferable, because developability can be adjusted on the basis of the ratio and concentration of silicon dioxide SiO$_2$, which is a component of silicate, and alkali metal oxide M$_2$O. The alkali metal silicates disclosed in, for example, JP-A No. 54-62004 and JP-B No. 57-7427 are preferable.

When an automatic developing machine is used to perform the development, by adding to the developing solution an aqueous solution (a replenishing solution) whose alkalinity is greater than that of the developing solution, a large amount of PS plates can be suitably processed without exchanging the developing solution in the development tank over a long period of time.

Various surfactants and organic solvents may be added to the developing solution and the replenishing solution as needed in order to accelerate or suppress developability, disperse development residue or enhance ink affinity at image portions of the printing plate. Preferable examples of the surfactant include anionic surfactants, cationic surfactants, nonionic surfactants and ampholytic surfactants. Moreover, reducing agents of inorganic acid sodium or potassium salt such as hydroquinone, resorcinol, sulfurous acid or hydrogensulfite, organic carboxylic acid, an antifoaming agent, a hard water softener and the like may be added to the developing solution or the replenishing solution as needed.

The image forming material thus developed with the developing solution and the replenishing solution is subjected to post-processings with washing water, a rinse containing a surfactant and the like, and a desensitizer containing gum arabic or a starch derivative. These processings can be variously combined and used as post-processing when the image forming material is used as a printing plate.

In recent years, automatic developing machines for plate materials in printing have come to be used widely, particularly in the plate-making and printing industries, because of the rationalization and standardization of plate-making labor. The automatic developing machine generally comprises a development section and a post-processing section, and has a device that conveys plate material for printing, various processing fluid tanks and a spray device. A printing plate once exposed is sprayed with various processing fluids that have been drawn up by pumps and sprayed out from spray nozzles while the plate is conveyed horizontally, whereby developing processing is carried out. Recently, a method has come to be known in which printing materials are dipped and conveyed by guide rolls in processing fluid tanks filled with processing fluids. In this type of automated processing, processing can be carried out by replenishing the various processing fluids with replenishing fluids in accordance with processing amount, operation time and the like.

Further, a so-called disposable processing system, in which processing is effected by substantially unused processing fluids, may also be suitably used.

By applying the evaluation method and the quality control method of the present invention to such development processing, a planographic printing plate whose quality is stable can be continuously obtained.

Description will now be given of a case in which the image forming material is used as a photosensitive planographic printing plate.

After the image forming material is exposed and developed, the material is washed with water and/or rinsed and/or degummed. When there are unnecessary image portions (e.g., a film edge mark of a negative film or the like) at the obtained planographic printing plate, the unnecessary image portions are eliminated.

Such elimination is preferably performed by the method disclosed in JP-B No. 2-13293. In this method, unnecessary image portions are coated with a removal solution, left for a predetermined time of period, and then washed with water. The method disclosed in JP-A No. 59-174842 may also be used. In this method, unnecessary image portions are irradiated with an active light beam guided by an optical fiber and then developed.

The planographic printing plate obtained in this manner may be subjected to a printing process after being coated with finisher as needed. However, when a planographic printing plate having an even higher printing durability is desired, a burning processing may be administered.

The planographic printing plate obtained in accordance with these processings is placed on an offset press or the like and then used to print a number of sheets.

EXAMPLES

The present invention will be described hereinafter by way of Examples. However, the present invention is not limited to the same.

Example 1
Synthesis of Specific Copolymer 1

31.0 g (0.36 mol) of methacrylic acid, 39.1 g (0.36 mol) of ethylchloroformate and 200 ml of acetonitrile were put into a 500 ml three-necked flask provided with an agitator, a cooling pipe and a dropping funnel, and the resultant mixture was agitated while being cooled in an ice bath. 36.4 g (0.36 mol) of triethylamine was dropped into the mixture by the dropping funnel over a period of about 1 hour. After the completion of the dropping, the ice bath was removed, and the mixture was agitated at room temperature for 30 minutes.

51.7 g (0.30 mol) of p-aminobenzene sulfonamide was added to the resultant reactant mixture, and the mixture was agitated for 1 hour while being warmed to 70° C. in an oil bath. After the completion of the reaction, the resultant mixture was charged into 1 liter of water while the water was agitated, and the resultant mixture was agitated for 30 minutes. The mixture was filtered, a precipitate was taken out, and the precipitate was added to 500 ml of water to form a slurry. Thereafter, the resultant slurry was filtered and the resultant solid was dried to prepare a white solid of N-(p-aminosulfonylphenyl)methacrylamide (yield: 46.9 g).

Next, 4.61 g (0.0192 mol) of N-(p-aminosulfonylphenyl)methacrylamide, 2.94 g (0.0258 mol) of ethyl methacrylate, 0.80 g (0.015 mol) of acrylonitrile and 20 g of N,N-dimethylacetamide were put into a 20 ml flask provided with an agitator, a cooling pipe and a dropping funnel, and the resultant mixture was agitated while being heated to 65° C. in a hot water bath. 0.15 g of V-65 (manufactured by Wako Jun'yaku K.K.) was added to the resultant mixture, and then agitated for 2 hours in an atmosphere of nitrogen while the temperature was kept at 65° C. A mixture of 4.61 g of N-(p-aminosulfonylphenyl)methacrylamide, 2.94 g of ethyl methacrylate, 0.80 g of acrylonitrile, N,N-dimethylacetamide and 0.15 g of V-65 was dropped into the reactant mixture by the dropping funnel over a period of 2 hours. After the completion of the dropping, the resultant mixture was further agitated at 65° C. for 2 hours. After the completion of the reaction, 40 g of methanol was added to the mixture, the mixture was cooled, and the resultant mixture was charged into 2 liters of water while the water was agitated. After the mixture was agitated for 30 minutes, a precipitate was taken out by filtering and dried to prepare 15 g of a white solid. A weight average molecular weight (polystyrene standard) of the specific copolymer 1 measured by gel permeation chromatography was 53,000.

Production of Substrate

An aluminum plate (material 1050) having a thickness of 0.30 mm was cleansed with trichloroethylene and degreased. The surface of the aluminum plate was then grained using a nylon brush and an aqueous suspension of 400 mesh pumice, and thoroughly washed with water. The aluminum plate was dipped into a 25% aqueous solution of sodium hyrdoxide at 45° C. for 9 seconds, etched, washed, then further dipped into a 20% aqueous solution of $HNO_3$ for 20 seconds and washed. The etching amount of the grained surface at this time was about 3 $g/m^2$. Next, using 7% $H_2SO_4$ as an electrolyte, the plate was disposed with a direct current anodic oxidized film of 3 $g/m^2$ at an electric current density of 15 $A/dm^2$. Thereafter, the plate was immersed in a 2.5 wt. % aqueous solution of sodium silicate at 30° C. for 10 seconds, and then coated with an undercoating liquid 1 described below. Subsequently, a coating film was dried at 80° C. for 15 seconds to obtain a substrate. The coating amount of the coated film after drying was 15 $mg/m^2$.

Undercoating Liquid 1

| | |
|---|---:|
| Copolymer having a molecular weight of 28,000 expressed below | 0.3 g |
| Methanol | 100 g |
| Water | 1 g |

Molecular weight: 28,000

A photosensitive liquid 1 described below was prepared. The resultant substrate was coated with the photosensitive liquid 1 so that a coating amount thereof was 1.3 $g/m^2$, thereby obtaining a planographic printing plate 1.

Photosensitive Liquid 1

| | |
|---|---:|
| Fluorine-contained polymer P-6 (see structural formula below) | 0.03 g |
| Specific copolymer 1 | 0.75 g |
| m,p-cresol novolac (m-p ratio: 6/4; weight average molecular weight: 3,500; containing unreacted cresol at 0.5% by weight) | 0.25 g |
| p-toluenesulfonic acid | 0.003 g |
| Tetrahydrophthalic anhydride | 0.03 g |
| Cyanine dye A (see structural formula below) | 0.017 g |
| Dye of 1-naphthalenesulfonate anion made from counter ion of Victoria pure blue BOH | 0.015 g |
| 3 methoxy-4-diazodiphenylaminehexafluorophosphate | 0.02 g |
| Fluorine-contained surfactant (Megafac F-177, manufactured by DAINIPPON INK & CHEMICALS INC.) | 0.05 g |
| methyl ethyl ketone | 10 g |
| 1-methoxy-2-propanol | 8 g |

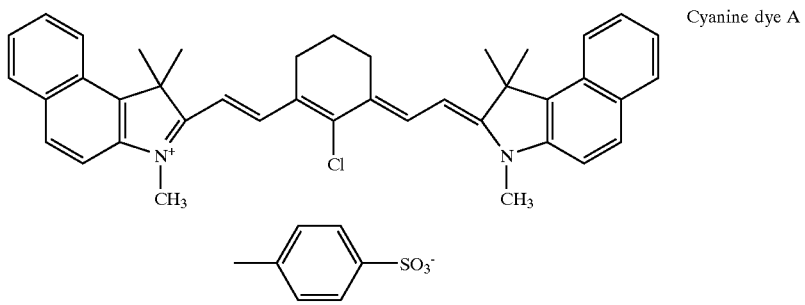

Cyanine dye A

P-6

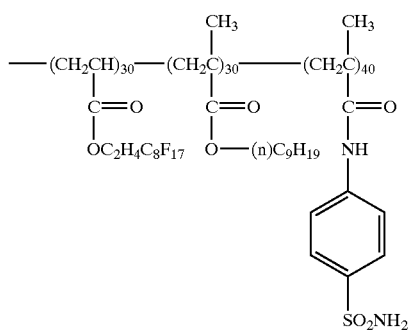

Next, 20 liters of an alkali development processing liquid A having a composition described below (pH: about 13) were charged into a development reservoir of a commercially available automatic developing machine LP-900H (manufactured by Fuji Photo Film Co., Ltd.) having a immersion-type development reservoir, and kept at a temperature of 30° C. 8 liters of tap water were charged into a second bath of the automatic developing machine LP-900H, and 8 liters of a finishing gum liquid diluted at a ratio of FP-2W (manufactured by Fuji Photo Film Co., Ltd.): water of 1:1, were charged into a third bath.

Composition of Alkali Development Processing Liquid A

| | |
|---|---|
| D sorbitol | 2.5% by weight |
| Sodium hydroxide | 0.85% by weight |
| Diethylene triaminepenta(methylenephosphonic acid) 5Na salt | 0.05% by weight |
| Water | 96.6% by weight |

A built-in development/replenishment control impedance of the automatic developing machine LP-900H was set at 40.5 ms/cm. While a development replenishing solution B described below was replenished, 100 exposed planographic printing plates 1 (650 mm×550 mm×0.3 mm) were developed per day for three months.

Composition of Development Replenishing Solution B

| | |
|---|---|
| D sorbitol | 5.6% by weight |
| Sodium hydroxide | 2.5% by weight |
| Diethylene triaminepenta(methylenephosphonic acid) 5Na salt | 0.2% by weight |
| Water | 91.7% by weight |

The planographic printing plate 1 (650 mm×550 mm×0.3 mm) was exposed using a Luxcel Platesetter 9000 CTP (manufactured by Fuji Photo Film Co., Ltd.) under the conditions of an output of 216 mW, revolutions of 1000 rpm, a resolution of 2438 dpi and an image area of about 20%.

Every day thereafter, a positive type planographic printing plate initially made by ultraviolet exposure (a positive type PS plate, trade name: VS, manufactured by Fuji Photo Film Co., Ltd.) was exposed in Mode 2 at 14 cts (6 W metal halide lamp/1 m) using a P-806G manufactured by Screen Inc. to obtain a gray scale. The clear sensitivity was measured by the use of the resultant gray scale.

On the first day, the clear sensitivity was 5.5 levels.

Thus, when the clear sensitivity deviated from the standard by a 0.5 level, the clear sensitivity was adjusted by changing the exposure amount to fall within the above-described range.

According to the quality control method of the present invention, development processing could be stably performed for 90 days. Incidentally, since the clear sensitivity became 6.0 levels on the 20th day, feedback was carried out on the basis of the quality control method of the present invention, so as to reduce the set exposure amount by 40%.

If the quality control method of the present invention had not been used, preferable planographic printing plates could only have been obtained for 20 days at the automatic developing machine.

In view of this, it was found that the quality control method of the present invention was effective.

Example 2

Production of Planographic Printing Plate 2

An aluminum plate (material 1050) having a thickness of 0.3 mm was cleansed with trichloroethylene and degreased. The surface of the aluminum plate was then grained using a nylon brush and an aqueous suspension of 400 mesh pumice, and thoroughly washed with water. The aluminum plate was dipped into a 25% aqueous solution of sodium hyrdoxide at 45° C. for 9 seconds, etched, washed, then further dipped into a 20% aqueous solution of $HNO_3$ for 20 seconds and washed. The etching amount of the grained surface at this time was about 3 g/m². Next, using 7% $H_2SO_4$ as an electrolyte, the plate was disposed with a direct current anodic oxidized film of 3 g/m² at an electric current density of 15 A/dm², then washed and dried.

Thereafter, the plate was immersed in a 2.5 wt.% aqueous solution of sodium silicate at 30° C. for 10 seconds, and then coated with an undercoating liquid 1 described below. Subsequently, a coating film was dried at 80° C. for 15 seconds to obtain a substrate. The coating amount of the coated film after drying was 15 mg/m².

Undercoating Liquid

| | |
|---|---|
| Above-described copolymer having a molecular weight of 28,000 | 0.3 g |
| Methanol | 100 g |
| Water | 1 g |

The resultant substrate was coated with a photosensitive liquid 2 described below in a coating amount of 1.8 g/m² to obtain a planographic printing plate 2.

Photosensitive Liquid 2

| | |
|---|---|
| m,p-cresol novolac (m-p ratio: 6/4; weight average molecular weight: 8000; containing unreacted cresol at 0.5% by weight) | 1.0 g |
| Pyrylium salt dye B (see structural formula below) | 0.1 g |
| Phthalic anhydride | 0.05 g |
| p-toluenesulfonic acid | 0.002 g |
| Dye of 6-hydroxy-β-naphthalenesulfonate made from counterion of ethyl violet | 0.02 g |
| Fluorine-contained surfactant (Megafac F-177, manufactured by DAINIPPON INK & CHEMICALS INC.) | 0.05 g |
| methyl ethyl ketone | 8 g |
| 1-methoxy-2-propanol | 4 g |

Dye B (structural formula of pyrylium salt dye B with Ph groups, $ClO_4^-$ counterion)

Subsequently, 20 liters of an alkali development processing liquid C having a composition listed below (pH: about 13) were charged into the development reservoir of the commercially available automatic developing machine LP-900H (manufactured by Fuji Photo Film Co., Ltd.) having an immersion-type development reservoir, and kept at a temperature of 30° C. 8 liters of tap water were charged into a second bath of the automatic developing machine LP-900H, and 8 liters of a finishing gum liquid diluted at the ratio of FP-2W (manufactured by Fuji Photo Film Co., Ltd.): water of 1:1 were charged into a third bath.

Composition of Alkali Development Processing Liquid C

| | |
|---|---|
| $SiO_2 \cdot K_2O$ ($K_2O/SiO_2$ = 1.1 (molar ratio)) | 4.0% by weight |
| Citric acid | 0.5% by weight |
| Polyethylene glycol (weight average molecular weight = 1000) | 0.5% by weight |
| Water | 95.0% by weight |

The exposed planographic printing plate 2 (650 mm×550 mm×0.24 mm) was processed by the automatic developing machine LP-900H while 35 cc of a developing replenishing solution D having a composition described below were replenished for each plate development processing.

Composition of Development Replenishing Solution D

| | |
|---|---|
| $SiO_2 \cdot K_2O$ ($K_2O/SiO_2$ = 1.1 (molar ratio)) | 5.0% by weight |
| Citric acid | 0.6% by weight |
| Polyethylene glycol (weight average molecular weight = 1000) | 0.6% by weight |
| Water | 93.8% by weight |

The planographic printing plate 2 (650 mm×550 mm×0.24 mm) was exposed using a Trendsetter 3244F platesetter manufactured by Creo Inc. under the conditions of an output of 9.0 W, revolutions of 150 rpm, a resolution of 2400 dpi and an image area of about 20%. 50 plates were developed per day for 60 days.

At that time, the clear sensitivity of an initially made plate was measured after exposure and development by the use of the gray scale which was prepared in Example 1. On the first day, the clear sensitivity was 5.5 levels.

Thus, when the clear sensitivity deviated from the standard by a 0.5 level, the exposure amount was changed.

According to the quality control method of the present invention, development processing could be stably performed for 90 days. Incidentally, since the clear sensitivity became 6.0 levels on the 15th day, feedback was carried out on the basis of the quality control method of the present invention, so as to reduce the set exposure amount by 40%.

If the quality control method of the present invention had not been used, preferable planographic printing plates could only have been obtained for 15 days at the automatic developing machine. In view of this, it was found that the quality control method of the present invention was effective.

Example 3

A planographic printing plate produced in the same manner as that in Example 2, and the same automatic developing machine and developing solution of Example 2 were used.

The planographic printing plate 2 (1030 mm×800 mm×0.30 mm) was exposed using the Trendsetter 3244F platesetter manufactured by Creo Inc. under the conditions of an output of 9.0 W, revolutions of 150 rpm, a resolution of 2400 dpi and an image area of about 15%. 40 plates were developed per day for 60 days.

At that time, the clear sensitivity of an initially made plate was measured after exposure and development by the use of the gray scale prepared in Example 1. On the first day, the clear sensitivity was 5.5 levels.

Thus, when the clear sensitivity deviated from the standard by a 0.5 level, the developing temperature was changed. According to this method, stable development was achieved until the 60th day. Specifically, since the clear sensitivity became 6.0 levels on the 10th day, the developing temperature was lowered by 2.0° C.

According to the quality control method of the present invention, development processing could be stably performed for 90 days. Incidentally, since the clear sensitivity exceeded the initial set value on the 10th day. If the quality control method of the present invention had not been used, preferable planographic printing plates could only have been obtained for 10 days at the automatic developing machine. In view of this, it was found that the quality control method of the present invention was effective.

Example 4

A planographic printing plate produced in the same manner as that of Example 3 and the same automatic developing machine and developing solution of Example 3 were used. Similarly, according to this method, when the clear sensitivity deviated from the standard by a 0.5 level, the developing time was changed. According to this method, stable development could be achieved until the 60th day. Specifically, since the clear sensitivity became 6.0 levels on the 10th day, the developing time was shortened by 2 seconds.

According to the quality control method of the present invention, development processing could be stably performed for 60 days. Incidentally, the clear sensitivity exceeded the initial set value on the 10th day. If the quality control method of the present invention had not been used, preferable planographic printing plates could only have been obtained for 10 days at the automatic developing machine. In view of this, it was found that the quality control method of the present invention was effective.

Example 5

A planographic printing plate prepared in the same manner as that of Example 3 and the same automatic developing machine and developing solution of Example 3 were used. Similarly, according to this method, when the clear sensitivity deviated from the standard by 0.5 level, the exposure condition was changed. According to this method, stable development could be achieved until the 60th day. Specifically, since the clear sensitivity became 5.0 levels on the 15th day, the exposure amount was increased by 40%.

According to the quality control method of the present invention, development processing could be stably performed for 60 days. Incidentally, since the clear sensitivity exceeded the initial set value on the 10th day. If the quality control method of the present invention had not been used, preferable planographic printing plates could only have been obtained for 15 days at the automatic developing machine. In view of this, it was found that the quality control method of the present invention was effective.

What is claimed is:

1. A quality control method for a planographic printing plate having disposed on a substrate a photosensitive layer formed by a resin soluble in an aqueous alkali solution and a compound that absorbs light to generate heat, the quality control method comprising the steps of:

(A) exposing, to an ultraviolet ray, a gray scale for evaluating a positive type planographic printing plate made by exposure to an ultraviolet ray, followed by development with a standard developing solution having a standard formula, and measurement of the sensitivity of the gray scale processed by the standard developing solution;

(B) exposing, to an ultraviolet ray, a gray scale for evaluating a positive type planographic printing plate made by exposure to an ultraviolet ray in the same manner as in the step (A), followed by development with a developing solution to be evaluated, and measurement of the sensitivity of the gray scale processed by the developing solution to be evaluated;

(C) comparing the sensitivity of the gray scale processed by the developing solution to be evaluated with the sensitivity of the gray scale processed by the standard developing solution; and (D) reducing the exposure by 30% to 50% when the sensitivity of the gray scale processed by the developing solution to be evaluated is increased by a 0.5 level greater than the sensitivity of the gray scale processed by the standard developing solution.

2. A quality control method for a planographic printing plate having disposed on a substrate a photosensitive layer formed by a resin soluble in an aqueous alkali solution and a compound that absorbs light to generate heat, the quality control method comprising the steps of:

(A) exposing, to an ultraviolet ray, a gray scale for evaluating a positive type planographic printing plate made by exposure to an ultraviolet ray, followed by development with a standard developing solution having a standard formula, and measurement of the sensitivity of the gray scale processed by the standard developing solution;

(B) exposing, to an ultraviolet ray, a gray scale for evaluating a positive type planographic printing plate made by exposure to an ultraviolet ray in the same manner as in the step (A), followed by development with a developing solution to be evaluated, and measurement of the sensitivity of the gray scale processed by the developing solution to be evaluated;

(C) comparing the sensitivity of the gray scale processed by the developing solution to be evaluated with the sensitivity of the gray scale processed by the standard developing solution; and (D) reducing development temperature by 0.5° C. to 2° C. when the sensitivity of the gray scale processed by the developing solution to be evaluated is increased by a 0.5 level greater than the sensitivity of the gray scale processed by the standard developing solution.

3. A quality control method for a planographic printing plate having disposed on a substrate a photosensitive layer formed by a resin soluble in an aqueous alkali solution and a compound that absorbs light to generate heat, the quality control method comprising the steps of:

(A) exposing, to an ultraviolet ray, a gray scale for evaluating a positive type planographic printing plate made by exposure to an ultraviolet ray, followed by development with a standard developing solution having a standard formula, and measurement of the sensitivity of the gray scale processed by the standard developing solution;

(B) exposing, to an ultraviolet ray, a gray scale for evaluating a positive type planographic printing plate made by exposure to an ultraviolet ray in the same manner as in the step (A), followed by development with a developing solution to be evaluated, and measurement of the sensitivity of the gray scale processed by the developing solution to be evaluated;

(C) comparing the sensitivity of the gray scale processed by the developing solution to be evaluated with the sensitivity of the gray scale processed by the standard developing solution; and (D) shortening developing time by 10% to 30% when the sensitivity of the gray scale processed by the developing solution to be evaluated is increased by a 0.5 level greater than the sensitivity of the gray scale processed by the standard developing solution.

4. A quality control method for a planographic printing plate having disposed on a substrate a photosensitive layer formed by a resin soluble in an aqueous alkali solution and a compound that absorbs light to generate heat, the quality control method comprising the steps of:

(A) exposing, to an ultraviolet ray, a gray scale for evaluating a positive type planographic printing plate made by exposure to an ultraviolet ray, followed by development with a standard developing solution having a standard formula, and measurement of the sensitivity of the gray scale processed by the standard developing solution;

(B) exposing, to an ultraviolet ray, a gray scale for evaluating a positive type planographic printing plate made by exposure to an ultraviolet ray in the same manner as in the step (A), followed by development with a developing solution to be evaluated, and measurement of the sensitivity of the gray scale processed by the developing solution to be evaluated;

(C) comparing the sensitivity of the gray scale processed by the developing solution to be evaluated with the sensitivity of the gray scale processed by the standard developing solution; and (D) increasing exposure by 30% to 50% when the sensitivity of the gray scale processed by the developing solution to be evaluated is decreased by a 0.5 level less than the sensitivity of the gray scale processed by the standard developing solution.

5. A quality control method for a planographic printing plate having disposed on a substrate a photosensitive layer formed by a resin soluble in an aqueous alkali solution and a compound that absorbs light to generate heat, the quality control method comprising the steps of:

(A) exposing, to an ultraviolet ray, a gray scale for evaluating a positive type planographic printing plate made by exposure to an ultraviolet ray, followed by development with a standard developing solution having a standard formula, and measurement of the sensitivity of the gray scale processed by the standard developing solution;

(B) exposing, to an ultraviolet ray, a gray scale for evaluating a positive type planographic printing plate made by exposure to an ultraviolet ray in the same manner as in the step (A), followed by development with a developing solution to be evaluated, and measurement of the sensitivity of the gray scale processed by the developing solution to be evaluated;

(C) comparing the sensitivity of the gray scale processed by the developing solution to be evaluated with the sensitivity of the gray scale processed by the standard developing solution; and (D) increasing development temperature by 0.5° C. to 2° C. when the sensitivity of the gray scale processed by the developing solution to be evaluated is decreased by a 0.5 level less than the sensitivity of the gray scale processed by the standard developing solution.

6. A quality control method for a planographic printing plate having disposed on a substrate a photosensitive layer formed by a resin soluble in an aqueous alkali solution and a compound that absorbs light to generate heat, the quality control method comprising the steps of:

(A) exposing, to an ultraviolet ray, a gray scale for evaluating a positive type planographic printing plate made by exposure to an ultraviolet ray, followed by development with a standard developing solution having a standard formula, and measurement of the sensitivity of the gray scale processed by the standard developing solution;

(B) exposing, to an ultraviolet ray, a gray scale for evaluating a positive type planographic printing plate made by exposure to an ultraviolet ray in the same manner as in the step (A), followed by development with a developing solution to be evaluated, and measurement of the sensitivity of the gray scale processed by the developing solution to be evaluated;

(C) comparing the sensitivity of the gray scale processed by the developing solution to be evaluated with the sensitivity of the gray scale processed by the standard developing solution; and (D) prolonging developing time by 10% to 30% when the sensitivity of the gray scale processed by the developing solution to be evaluated is decreased by a 0.5 level less than the sensitivity of the gray scale processed by the standard developing solution.

* * * * *